United States Patent [19]
Phillips, Jr.

[11] Patent Number: 5,404,372
[45] Date of Patent: Apr. 4, 1995

[54] SINGLE METAL LEVEL LASER ARRAY

[75] Inventor: Alfred Phillips, Jr., Wappingers Falls, N.Y.

[73] Assignee: International Business Machines Corporation, Armonk, N.Y.

[21] Appl. No.: 786,234

[22] Filed: Oct. 31, 1991

[51] Int. Cl.6 .............................................. H01S 3/19
[52] U.S. Cl. ...................................... 372/50; 372/46
[58] Field of Search ................................. 372/50, 46

[56] References Cited

U.S. PATENT DOCUMENTS

| | | | |
|---|---|---|---|
| 4,047,124 | 9/1977 | Comerford et al. | 331/94.5 |
| 4,297,653 | 10/1981 | Scifres et al. | 331/94.5 |
| 4,461,007 | 7/1984 | Burnham e tal. | 372/45 |
| 4,620,307 | 10/1986 | Kappeler | 372/50 |
| 4,675,518 | 6/1987 | Oimura et al. | 250/205 |
| 4,719,498 | 1/1988 | Wada et al. | 357/30 |
| 4,766,472 | 8/1988 | Brillouet et al. | 357/19 |
| 4,977,570 | 12/1990 | Hasegawa | 372/50 |

Primary Examiner—James W. Davie
Attorney, Agent, or Firm—Ira David Blecker

[57] ABSTRACT

A laser array for a large number of lasers which are manufactured on a single metal level is taught. Briefly stated the cavity length of the lasers are shortened so as to provide for metal lands or traces to be disposed adjacent to rear facets of the laser for eventual interconnection with pads. The diminution in cavity length does not degrade laser performance or characteristics, while performance and characteristics amongst adjacent lasers is similar.

8 Claims, 2 Drawing Sheets

SINGLE METAL LEVEL LASER ARRAY

This invention relates generally, to laser arrays and more particularly to laser arrays disposed on a single level on a substrate.

BACKGROUND OF THE INVENTION

Due to the increased needs for speed and band width in communication, particularly within mainframes, various computers and their subsystems, the use of semi conductor lasers is being increased. Accordingly, there is a significant need to reduce the size and footprint of not just a single laser on a semi-conductor substrate, but also an array of lasers.

It is well known that semi-conductor lasers of all types and particularly GaAs lasers are in and of themselves difficult and expensive to manufacture. Moreover, in order to increase band-width and speed, laser arrays which are to be produced must be produced easily and densely in order to justify their increased cost. Further they must be produced under strict process requirements, strict tolerance levels, and in decreasing size as well.

One of the problems with laser arrays is the practical aspects of bonding leads to the laser pads for power and control. Heretofore however, when manufacturing an array of lasers it has been contemplated that a second level of metal and submetals should be utilized for the simple reason that leadlines to all the various pin out pads could not be provided/fit on a single level semiconductor substrate. Unfortunately, the use of a second level of metal or submounts adds significant cost to the process and labor while decreasing reliability and of course yield.

A number of schemes have been utilized to produce laser such as found in U.S. Pat. No. 4,047,124 "Planar Solid State Laser Array" issued Sept. 6, 1977 to Cumerford et. al. This reference forms optical lasers on a single chip using corrugation wherein the corrugation is chosen so that laser radiation exits from the array in a direction normal to the plane of the wave guide, which is generally undesirable. U.S. Pat. No. 4,461,007 "Injection Lasers with short active regions" issued Jul. 17, 1984, to Burnham et. al. discloses a plurality of lasers having staggered active regions. However, these and heretofore other related teachings are disadvantageous in that they are expensive to produce, require multiple levels of metalization, or simply do not allow for the density indicated by the present invention.

Accordingly, it is an object and intention of the present inventor to produce a semiconductor laser array utilizing a single level of metal thereby providing pads or pinouts directly adjacent thereto and which can be expanded to N number of lasers, where N is an integer.

Accordingly, it is an object and intention of the present invention to produce a semiconductor Laser array, comprising a semiconductor substrate, a plurality of light emitting lasers disposed thereon, at least one metal land emanating from each of the plurality of light emitting lasers, wherein each of the metal lands are disposed on the the same single level of the semiconductor substrate.

DETAILED DESCRIPTION OF THE PREFERRED EMBODIMENT

Figure 1:
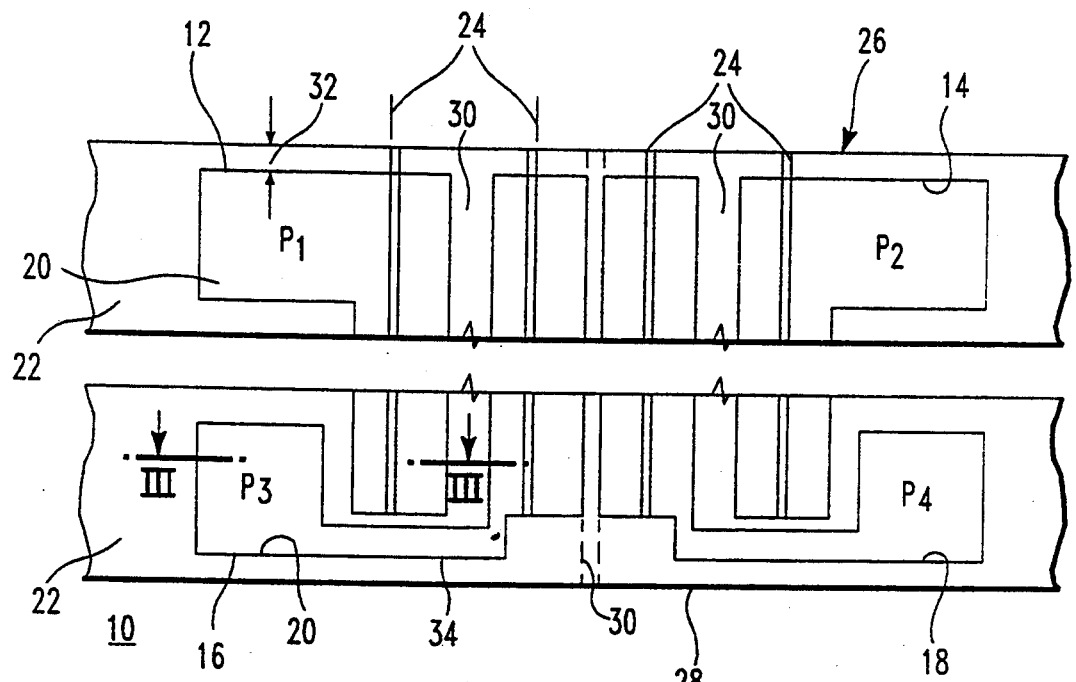
FIG. 1 is a plan view of a GRINSCH-type quad laser array.

Referring now to FIG. 1, there is shown a planar diagrammatic view of the metal and ridge of a GRINSCH-TYPE quad laser array. It should be noted that the approximate sizes/proportions are not to scale but are drawn so as to aid in clear disclosure and understanding of the invention. Accordingly, shown generally is the quad laser array 10. Disposed thereon are four pads; pad P 1, pad P 2, pad P 3, and pad P 4 (delegated 12, 14, 16, 18 respectively). The pads 1-4 are sized suitably for bonding purposes as is readily known to one skilled in the art. In the preferred embodiment of the present invention, the pad dimensions are: 25 micrometers ($\mu$ meters) by 25$\mu$ meters but are easily extendible to 150 by 150$\mu$ meters. The front facet of the laser is shown generally at edge 26, while the rear facet is shown generally at edge 28. In the preferred embodiment of the present invention the dimension between the front to rear facets 26, 28 is 750$\mu$ meters, therefore effectively providing a 750$\mu$-meter cavity length. However it has been found, and it is the intention of this invention to utilize such discovery, that the cavity length or distance is not critical and that slight deviations do not degrade or modify the laser or light emanating therefrom.

The pads P1-P4 are metal and are disposed alongside Nitride 22. Ridges 24 are provided as normally is the case in laser manufacturing. The ridges 24 are in the range of 100-1500 micrometers in length. In the preferred embodiment of the present invention the ridge to ridge spacing is preferably 50 to 150$\mu$-meters, although other variations can and may be practiced without deviating from the scope and spirit of the present invention.

The smaller dimension, i.e. 50$\mu$-meters is preferably sized so as to avoid unwanted crosstalk, whether optical, electrical or thermal, for a given application. In this regard, ridge to ridge spacing as small as or approaching 20$\mu$-meters may be practicable simply by providing an insulation barrier between adjacent lasers. This insulation barrier may be formed by ion milling, or proton-bombardment. In this regard crosstalk isolation regions 30 are provided. Metal Lands 34 emanate from the interior array lasers and run to the Pads P3 and P4. This has been found to produce negligible effects and differentiation in operation of the interior and exterior lasers.

Figure 3:
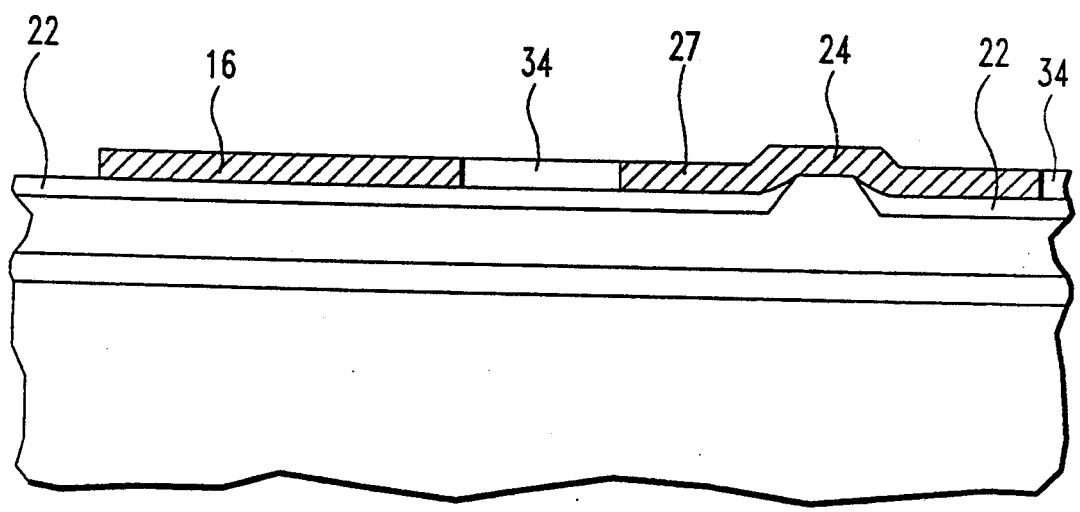
FIG. 3 is a cross sectional view of the laser array along line III—III of FIG. 1.

In the preferred embodiment of the present invention the metal lands are approximately 3$\mu$-meters wide for a 750$\mu$-meter cavity laser. The metal lands 34 have a width as mentioned that provides an acceptable conductive path from the electrodes 27 of the interior lasers to the pads. These metal lands 34 pass over nitride 22 as distinct from the ridges of the outer lasers. Referring now to FIG. 3, it can be seen that pad 16, land 34, electrode 27 and ridge 24 are all the same level of metallization on the nitride layer 22.

Accordingly, it has been found that by shortening the cavity length to accommodate lands for eventual connection to pads, the overall efficiency and operating characteristics of the lasers are not appreciably diminished. Additionally, this shortening does not produce different operating conditions from cavity to cavity along the semiconductor substrate. Accordingly it is readily apparent how this shortening of the cavity allows for single level production as opposed to use of a multi-level structure.

Figure 2:
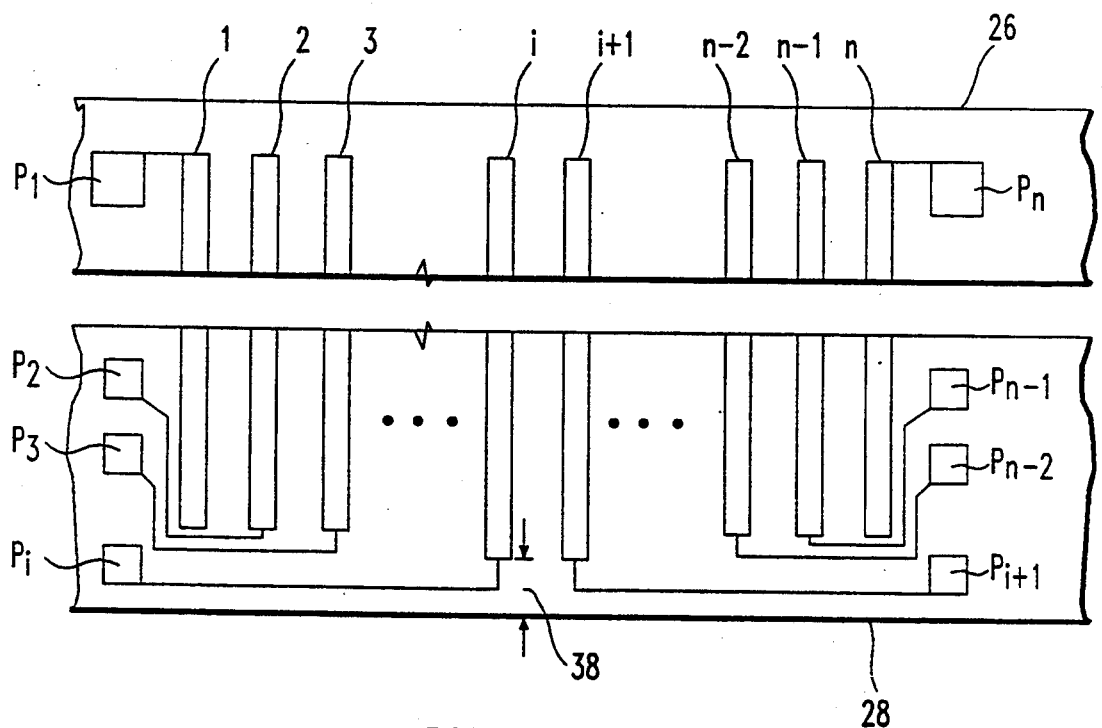
FIG. 2 is a plan view of a laser array having N number of lasers thereon.

Referring now to FIG. 2 there is shown a multiple laser array, referred to as an N Laser Array 36. Here it can be seen how the cavity lengths disposed between the front and rear facets 26, 28 are pulled back such that a pull back distance 38 is produced. This distance is determined by the number of lasers which in turn is a function of the width of the metal lands. Additionally, it is also a function of the laser properties, lithographic capabilities, and metal current capabilities as is readily known and apparent. In this fashion it may be seen how the number of ridges 1, 2, 3, through i, may be formed and are interconnected with pads P1, P2, P3, through P-i respectively. Similarly, pads i+1, N−2, N−1, and N are interconnected with pads Pi+1, PN−2, PN−1, PN−1 through PN respectively.

Accordingly, the present invention maintains relatively simple and inexpensive manufacturing techniques similar to that of single or small semi-conductor lasers even though the number of lasers in the array may be increased as desired. Even though the laser cavities are decreased in length, since all cavities are maintained at the same length, overall operating characteristics from device to device are not appreciably downgraded or diminished.

What is claimed is:

1. A Semiconductor Laser array, comprising:
a semiconductor substrate;
a plurality of light emitting lasers disposed thereon; a plurality of bonding pads situated on said semiconductor substrate and adjacent to said light emitting lasers with no pads situated between said light emitting lasers; at least one metal land means connected to each of said plurality of light emitting lasers for facilitating electrical contact between a light emitting laser and bonding pad associated with said at least one metal land means, wherein each of said at least one metal land means, bonding pads and light emitting lasers are disposed on the same single level of said semiconductor substrate.

2. A device according to claim 1 wherein each of said plurality of light emitting lasers has a front facet and a rear facet, said lasers comprised of a ridge disposed perpendicular to and between said front facet and said rear facet.

3. A device according to claim 2 wherein at least one of said at least one metal land means of one of said plurality of light emitting lasers is adjacent to said front facet and at least one of said at least one metal land means of another of said plurality of light emitting lasers is adjacent said rear facet.

4. A device according to claim 1 wherein at least four light emitting lasers are disposed on said semiconductor substrate.

5. A device according to claim 2 wherein at least four light emitting lasers are disposed on said semiconductor substrate.

6. A device according to claim 2 wherein said ridges are in the range of 100–1500 micro meters.

7. A device according to claim 1 wherein said bonding pads are disposed parallel to said ridges, between said front facet of said semiconductor substrate and said rear facet of said semiconductor substrate.

8. A device according to claim 1 wherein said light emitting laser is a horizontal type light emitting laser.

* * * * *